(12) United States Patent
Lee

(10) Patent No.: US 9,953,921 B2
(45) Date of Patent: Apr. 24, 2018

(54) SEMICONDUCTOR DEVICE AND SEMICONDUCTOR PACKAGE

(71) Applicant: SK hynix Inc., Gyeonggi-do (KR)

(72) Inventor: Hyun-Bae Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/090,212

(22) Filed: Apr. 4, 2016

(65) Prior Publication Data

US 2017/0141025 A1    May 18, 2017

(30) Foreign Application Priority Data

Nov. 13, 2015    (KR) .................. 10-2015-0159707

(51) Int. Cl.
| | | |
|---|---|---|
| *H03K 3/00* | (2006.01) | |
| *H01L 23/528* | (2006.01) | |
| *H01L 23/522* | (2006.01) | |
| *H01L 25/065* | (2006.01) | |

(52) U.S. Cl.
CPC ........ *H01L 23/528* (2013.01); *H01L 23/5223* (2013.01); *H01L 25/0657* (2013.01)

(58) Field of Classification Search
CPC . H03K 3/00; H03K 3/01; H03K 3/011; H03K 3/012; H03K 3/013; H03K 3/014; H03K 3/015; H03K 3/017; H01L 21/60; H01L 21/603; H01L 21/607; H01L 23/48; H01L 23/482; H01L 23/485; H01L 23/488; H01L 23/49; H01L 23/492; H01L 23/495; H01L 23/498; H01L 23/50
USPC ........................................................ 327/109
See application file for complete search history.

(56) References Cited

U.S. PATENT DOCUMENTS 5,376,902 A * 12/1994 Bockelman ............. H01L 23/66
                                                                333/246
2015/0179570 A1* 6/2015 Marimuthu ......... H01L 25/0652
                                                                257/774

FOREIGN PATENT DOCUMENTS

| KR | 1020100041310 |   | 4/2010 |
|---|---|---|---|
| KR | 101148596 |   | 5/2012 |
| KR | 101148596 | * | 12/2012 |

* cited by examiner

*Primary Examiner* — Patrick Chen
(74) *Attorney, Agent, or Firm* — IP & T Group LLP

(57) ABSTRACT

A semiconductor device may include a first metal line; a second metal line; a first insulating layer formed between the first metal line and the second metal line; a first driving unit coupled to the first metal line, the first driving unit being suitable for driving the first metal line in response to first data; and a second driving unit coupled to the second metal line, the second driving unit being suitable for driving the second metal line in response to second data obtained by inverting and delaying the first data.

16 Claims, 6 Drawing Sheets

SEMICONDUCTOR DEVICE AND SEMICONDUCTOR PACKAGE

CROSS-REFERENCE TO RELATED APPLICATION(S)

The present application claims priority of Korean Patent Application No. 10-2015-0159707, filed on Nov. 13, 2015, the disclosure of which is incorporated herein in its entirety by reference.

BACKGROUND

1. Field

Exemplary embodiments of the present invention relate to a semiconductor device and a semiconductor package.

2. Description of the Related Art

Consumer demand for mobile devices such as personal digital assistants (PDA), third-generation (3G) mobile phones, and digital sail cameras requires more capacity to run diverse applications and smaller size. Such need has been satisfied by employing fine processing semiconductor technology. However, as this technology has reached its limits due to increases in development periods and costs thereof a multi-chip package (MCP) technology is being adopted in mobile devices. A MCP refers to a complex chip product in which various semiconductor chips, such as, for example, NOR flash, NAND flash, SRAM, and UtRAM chips are mounted on a single package. In general, the MCP has a structure in which two, four or more of the same type semiconductor chips form a stack. Generally in an MCP the mounting area of the semiconductor chips forming the MCP may be reduced by 50% or more. The wiring of the semiconductor chips may also be simplified compared to using separate semiconductor chips. Accordingly, the cost of mobile devices may be reduced. Also, the productivity of the mobile devices may be improved.

In general, a semiconductor memory device, for example, a dynamic random access memory (DRAM), includes a data transmission circuit for outputting internal data to an external device. Furthermore, high-speed data transmission circuits for outputting data at the data rate of gigabits per second (Gbps) employ an emphasis method for reducing inter-symbol interference (ISI) jitter. A conventional emphasis method is described below.

FIG. 1 is a diagram showing gains in a data transmission circuit, a transmission line, and a data reception circuit without an emphasis operation (a) and with an emphasis operation (b).

Referring to FIG. 1, a data transmission line 120 has low pass filter characteristic due to parasitic resistance and capacitance. Accordingly, if an emphasis operation has not been applied (a), there may be a distortion in data transmitted by a data transmission circuit 110 through the data transmission line 120 so that a data reception circuit 130 receives data whose gain in a high frequency portion has been reduced.

An emphasis method may strengthen a high frequency component of a signal (or data) and send the strengthened signal by a data transmission circuit 110 by taking into consideration the aforementioned high frequency signal distortion. Hence, applying an emphasis method (b), the data transmission circuit 110 strengthens the high frequency component of a signal and outputs the strengthened signal. Accordingly, although the data transmission line 120 has a low pass filter characteristic, the data reception circuit 130 may receive a signal having the same gain for each frequency.

FIG. 2 is a diagram showing the waveform of data according to an emphasis operation in a conventional data transmission circuit.

Referring to FIG. 2, an emphasis operation may strengthen the level of data DATA when the data DATA shifts. For example, when the data DATA shifts from a low logic to a high logic, driving the data DATA to a "high" value is strengthened during a specific period. When the data DATA shifts from a high logic to a low logic, driving the data DATA to a "low" value is strengthened during a specific period. A high frequency component of the data DATA is generated at the moment when the data DATA shifts. Accordingly, an emphasis operation at the moment when the data DATA shifts may strengthen the high frequency component of the data DATA.

FIG. 3 shows the configuration of a data transmission circuit for performing an emphasis operation.

Referring to FIG. 3, the data transmission circuit may include an output driver 310, an emphasis driver 320, and an output pad 330.

The output driver 310 may be coupled to the output pad 330, and may drive the output pad 330 in response to output data OUT_DATA. The output driver 310 may pull-up drive the output pad 330 when the output data OUT_DATA is high data and may pull-down drive the output pad 330 when the output data OUT_DATA is low data.

The emphasis driver 320 may be coupled to the output pad 330, and may drive the output pad 330 in response to emphasis data EM_DATA. The emphasis driver 320 may pull-up drive the output pad 330 when the emphasis data EM_DATA is high data and may pull-down drive the output pad 330 when the emphasis data EM_DATA is low data. The emphasis data EM_DATA may be generated for driving the emphasis driver 320 so that the transition of the output data OUT_DATA is strengthened. The emphasis data EM_DATA may be generated by delaying and inverting the output data OUT_DATA. For reference, the driving force of the emphasis driver 320 may be set to have a specific ratio with respect to the driving force of the output driver 310.

A driver coupled to the output pad 330 functions as a load. Accordingly, if both the output driver 310 and the emphasis driver 320 are coupled to the output pad 330 as described above a load on the output pad 330 may be excessively increased.

SUMMARY

Various embodiments of the present invention are directed to a semiconductor device and semiconductor package capable of reducing load capacitance of an output pad by performing pre-emphasis driving through a capacitor.

Also, various embodiments of the present invention are directed to a semiconductor device and a semiconductor package which use the stack structure of metal lines formed to be used as an output pad, as the capacitor, without occupying a separate area for the capacitor.

In an embodiment of the present invention, a semiconductor device may include a first metal line; a second metal line; a first insulating layer formed between the first metal line and the second metal line; a first driving unit coupled to the first metal line, the first driving unit being suitable for driving the first metal line in response to first data; and a second driving unit coupled to the second metal line, the second driving unit being suitable for driving the second metal line in response to second data obtained by inverting and delaying the first data.

In an embodiment of the present invention, a semiconductor device may include a plurality of pad groups arranged in a first direction, each of the pad groups comprising first and second metal lines stacked in a second direction; a plurality of first driving units suitable for driving the first metal lines of the pad groups, respectively, in response to first data; and a plurality of second driving units suitable for driving the second metal lines of the pad groups, respectively, in response to second data obtained by inverting and delaying the first data.

In an embodiment of the present invention, a semiconductor package may include silicon substrate and a plurality of semiconductor devices stacked on the silicon substrate. Each of the plurality of semiconductor devices may include a plurality of pad groups arranged in a first direction, each of the pad groups comprising first and second metal lines stacked in a second direction; a plurality of first driving units suitable for driving the first metal lines of the pad groups, respectively, in response to first data; and a plurality of second driving units suitable for driving the second metal lines of the pad groups, respectively, in response to second data obtained by inverting and delaying the first data.

In an embodiment of the present invention, a semiconductor device may include first and second metal lines formed as an output pad group to have an insulating layer therebetween; a first driving unit suitable for driving the first and second metal lines in response to first and second data, respectively; and a second driving unit suitable for driving the first metal line in response to third data when the second data shift, and driving the second metal line in response to fourth data when the first data shift, wherein the third and fourth data are obtained by inverting and delaying the second and first data respectively.

DETAILED DESCRIPTION

Figure 1:
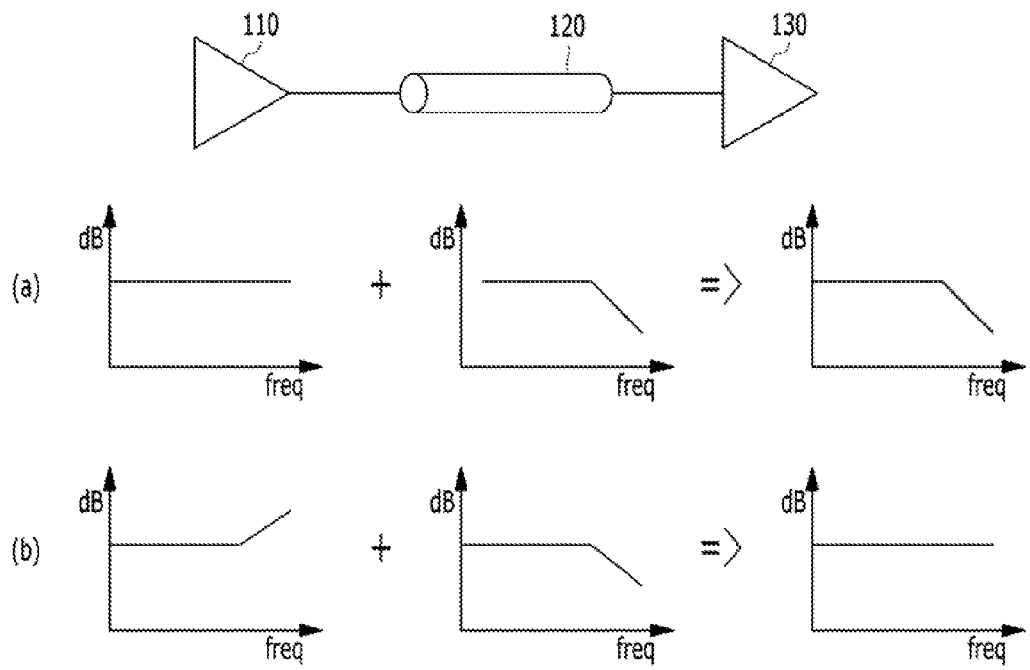
FIG. 1 is a diagram showing gains in a conventional data transmission circuit with and without an emphasis operation.
Figure 2:
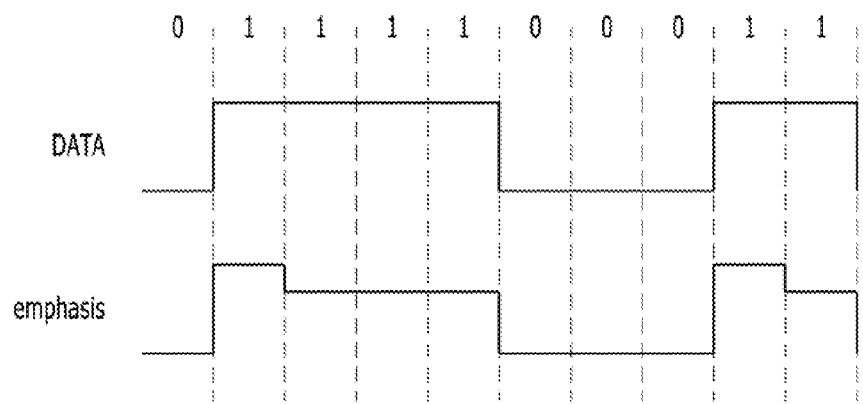
FIG. 2 is a diagram showing the waveform of data according to an emphasis operation in a conventional data transmission circuit.
Figure 3:
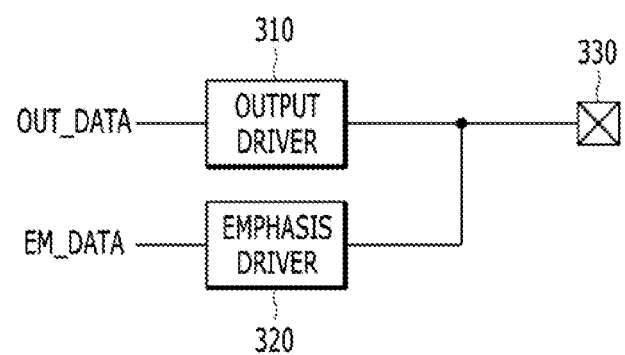
FIG. 3 shows the configuration of a conventional data transmission circuit for performing an emphasis operation.

Various embodiments will be described below with reference to the accompanying drawings. It is noted, however, that the present invention may be embodied in different forms and should not be construed as being limited to the embodiments set forth herein. Rather, these embodiments are provided so that this disclosure will be thorough and complete. Throughout the disclosure, like reference numerals are used to refer to like parts in the various figures and embodiments of the present invention.

The drawings may not be necessarily to scale and in some instances, proportions of at least some structures in the drawings may be exaggerated in order to dearly illustrate certain features of the embodiments. When a first layer is referred to as being "on" a second layer or "on" a substrate, the first layer may be formed directly on the second layer or the substrate but may also be formed on a third layer existing between the first layer and the second layer or the substrate.

Figure 4A:
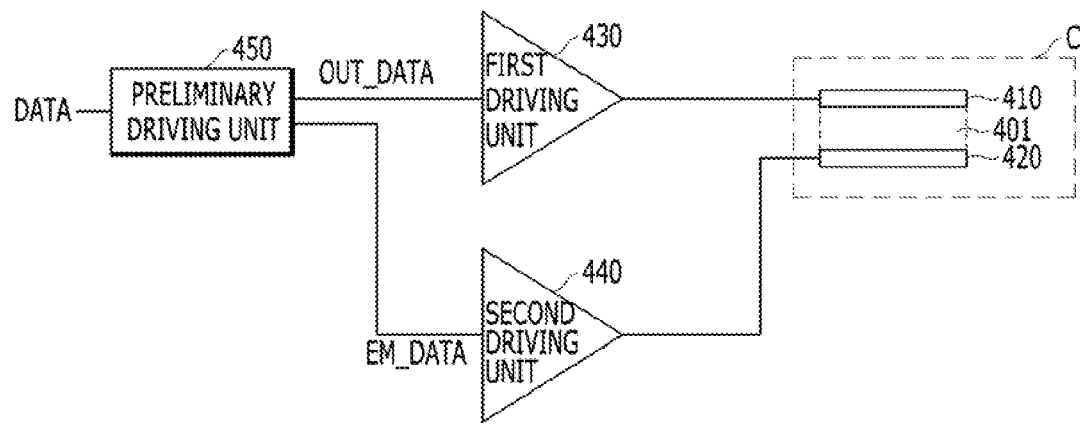
FIGS. 4A to 4C show configurations of semiconductor devices, according to embodiments of the present invention.
Figure 4B:
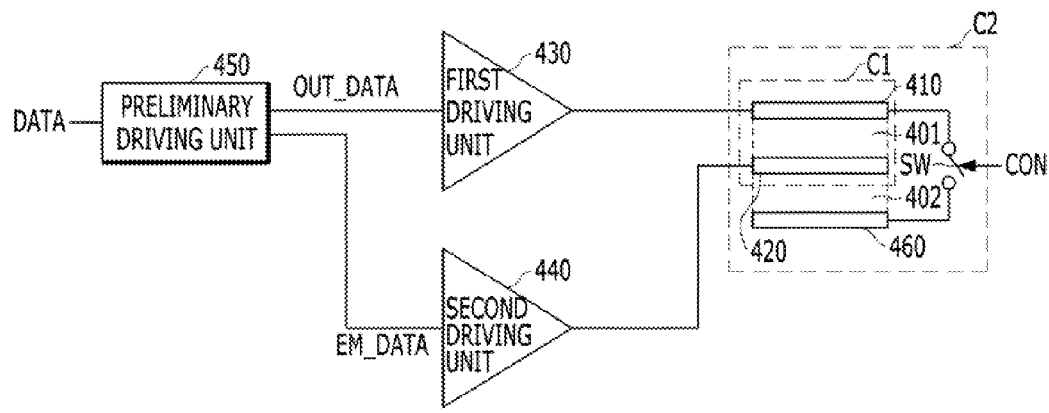
Figure 4C:
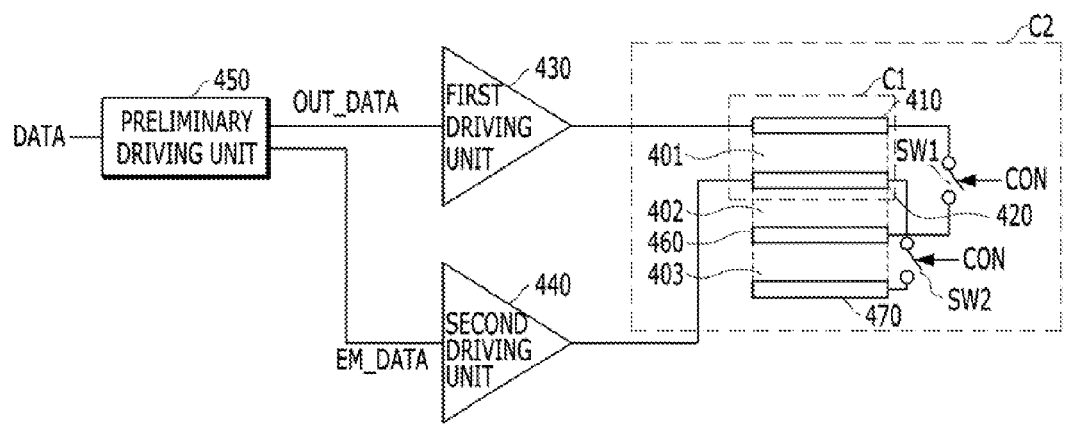

FIGS. 4A to 4C show configurations of semiconductor devices, according to embodiments of the present invention.

FIG. 4A shows the configuration of a semiconductor device in which two metal lines are stacked.

Referring to FIG. 4A, the semiconductor device may include a first metal line 410, a second metal line 420, a first driving unit 430, and a second driving unit 440.

The first and the second metal lines 410 and 420 may be used as a data output pad for outputting data to an external device coupled with the semiconductor device. The first metal line 410 may be an output pad which is used to output data to an external device coupled with the semiconductor device. The first metal line 410 may be stacked over the second metal line 420. An insulating layer 401 may be formed between the first metal line 410 and the second metal line 420. The first metal line 410, the insulating layer 401, and the second metal line 420 may form a capacitor structure C.

The first driving unit 430 may be coupled to the first metal line 410, and may drive the first metal line 410 in response to output data OUT_DATA received from a preliminary driving unit 450. The first driving unit 430 may pull-up drive the first metal line 410 when the output data OUT_DATA is high data and may pull-down drive the second metal line 420 when the output data OUT_DATA is low data. The first driving unit 430 may be an output driver for outputting data.

The second driving unit 440 may be coupled to the second metal line 420, and may drive the second metal line 420 in response to emphasis data EM_DATA received from the preliminary driving unit 450. The second driving unit 440 may pull-up drive the second metal line 420 when the emphasis data EM_DATA is high data and may pull-down drive the second metal line 420 when the emphasis data EM_DATA is low data. The second driving unit 440 may be an emphasis driver for emphasis driving.

The preliminary driving unit 450 may generate the output data OUT_DATA by sending input data DATA without any changes (e.g. without any delay or inversion) or may generate the emphasis data EM_DATA by changing the input data DATA, for example, by at least one of delaying and inverting the input data DATA. The emphasis data EM_DATA may have the same phase as data obtained by delaying and inverting the output data OUT_DATA.

In the semiconductor device of FIG. 4A, the second driving unit 440 is not directly coupled to the first metal line 410 corresponding to an output pad. The second driving unit 440 may perform emphasis driving through the second metal line 420 forming the capacitor structure C along with the first metal line 410. Since the second metal line 420 and the first metal line 410 are coupled, the voltage of the first metal line 410 is influenced by the voltage of the second metal line 420. Accordingly, the second driving unit 440 may indirectly drive the first metal line 410 through the second metal line 420 using such a phenomenon.

If emphasis driving is performed using the capacitor structure C as described above, a load attributable to the second driving unit 440, that is, the emphasis driver, may be removed from the first metal line 410, that is, the output pad, thereby reducing a load on the output pad. Furthermore, a semiconductor may include a plurality of metal lines to be used as an output pad. Accordingly, using such metal lines, emphasis driving may be performed as described above even without forming a separate capacitor.

FIG. 4B shows the configuration of a semiconductor device in which three metal lines are stacked.

Referring to FIG. 4B, the semiconductor device may include a first metal line 410, a second metal line 420, a first driving unit 430, a second driving unit 440, a preliminary driving unit 450, and a third metal line 460.

Each of the first to third metal lines 410, 420, and 460 may be used as a data output pad for outputting data to an external device coupled with the semiconductor device. The first metal line 410 may be an output pad which is used to output data to an external device coupled with the semiconductor device. The first metal line 410 may be stacked over the second metal line 420. A first insulating layer 401 may be formed between the first metal line 410 and the second metal line 410. Furthermore, the second metal line 420 may be stacked over the third metal line 460. A second insulating layer 402 may be formed between the second metal line 420 and the third metal line 450.

The first metal line 410 and the third metal line 460 may be coupled through a switch SW that is turned on/off in response to a control signal CON. The control signal CON may be enabled if capacitance between the first metal line 410, that is, the output pad, and the second driving unit 440, that is, an emphasis driver, needs to be increased. The switch SW may be turned on when the control signal CON is enabled, thus electrically coupling the first metal line 410 and the third metal line 460.

When the switch SW is turned off, the first metal line 410, the first insulating layer 401, and the second metal line 420 may form a first capacitor structure C1. When the switch SW is turned on, the first metal line 410, the third metal line 460, the first and second insulating layers 401 and 402 and the second metal line 420 may form a second capacitor structure C2. In this case, the second capacitor structure C2 may have a higher capacitance value than the first capacitor structure C1.

FIG. 4C shows the configuration of a semiconductor device in which four metal lines are stacked.

Referring to FIG. 4C, the semiconductor device may include a first metal line 410, a second metal line 420, a first driving unit 430, a second driving unit 440, a preliminary driving unit 450, a third metal line 460, and a fourth metal line 470.

Each of the first to fourth metal lines 410, 420, 460, and 470 may be used as a data output pad for outputting data to an external device coupled with the semiconductor device. The first metal line 410 may be an output pad which is used to output data to an external device coupled with the semiconductor device. The first metal line 410 may be stacked over the second metal line 420. A first insulating layer 401 may be formed between the first metal line 410 and the second metal line 410. Furthermore, the second metal line 420 may be stacked over the third metal line 460. A second insulating layer 402 may be formed between the second metal line 420 and the third metal line 460. Furthermore, the third metal line 460 may be stacked over the fourth metal line 470. A third insulating layer 403 may be formed between the third metal line 460 and the fourth metal line 470.

The first metal line 410 and the third metal line 460 may be coupled through a first switch SW1 that is turned on/off in response to a control signal CON. The second metal line 420 and the fourth metal line 470 may be coupled through a second switch SW2 that is turned on/off in response to the control signal CON. The control signal CON may be enabled when capacitance between the first metal line 410, that is, the output pad, and the second driving unit 440, that is, an emphasis driver, needs to be increased. The first switch SW1 may be turned on when the control signal CON is enabled, thus electrically coupling the first met line 410 and the third metal line 460. Furthermore, the second switch SW2 may be turned on when the control signal CON is enabled, thus electrically coupling the second metal line 420 and the fourth metal line 470.

When the first and second switches SW1 and SW2 are turned off, the first metal line 410, the first insulating layer 401, and the second metal line 420 may form a first capacitor structure C1. When the first and the second switches SW1 and SW2 are turned on, the first metal line 410, the third metal line 460, the first to third insulating layers 401 to 403, the second metal line 420, and the fourth metal line 470 may form a second capacitor structure C2. In this case, the second capacitor structure C2 may have a higher capacitance value than the first capacitor structure C1.

Figure 5:
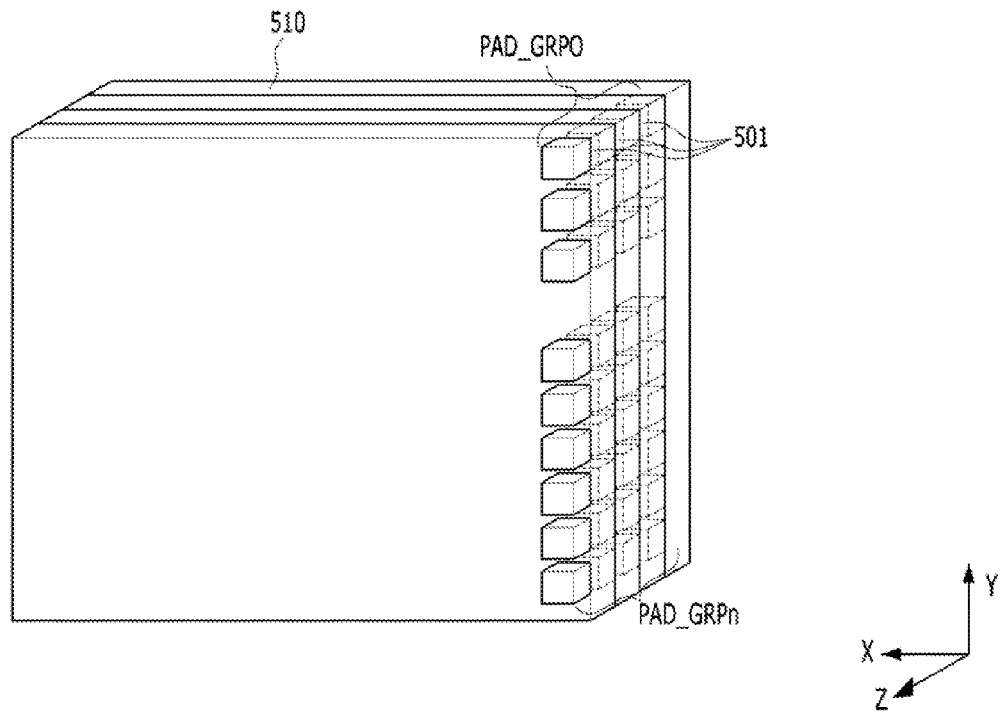
FIG. 5 is a perspective view of a semiconductor device, according to an embodiment of the present invention.

FIG. 5 is a perspective view of a semiconductor device, according to an embodiment of the present invention.

Referring to FIG. 5, the semiconductor device may include a plurality of pad groups PAD_GRP0, to PAD_GRPn for inputting and outputting data.

The semiconductor device includes a plurality of layers between which an insulating layer 501 is interposed over a silicon substrate 510. A plurality of metal lines extending in an X direction and arranged in a Y direction may be formed in each of the layers. A plurality of metal lines stacked in the same line in a Z direction may form a single pad group.

In this case, since an insulating layer is interposed between a plurality of metal lines included in the same pad group, the plurality of metal lines included in the same pad group may form a capacitor structure through a metal/insulating material/metal structure.

Figure 6A:
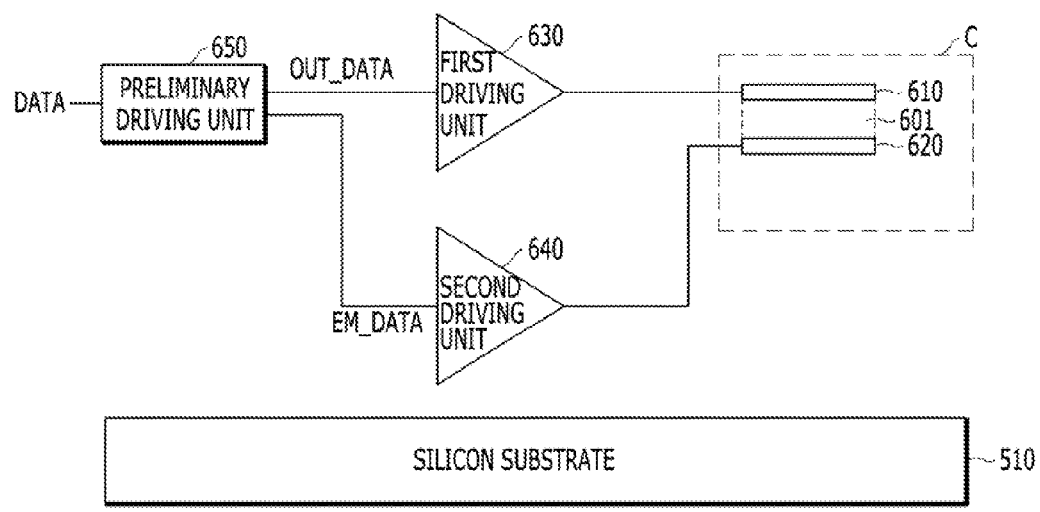
FIGS. 6A to 6C are diagrams showing parts of the configurations of semiconductor devices, according to embodiments of the present invention.
Figure 6B:
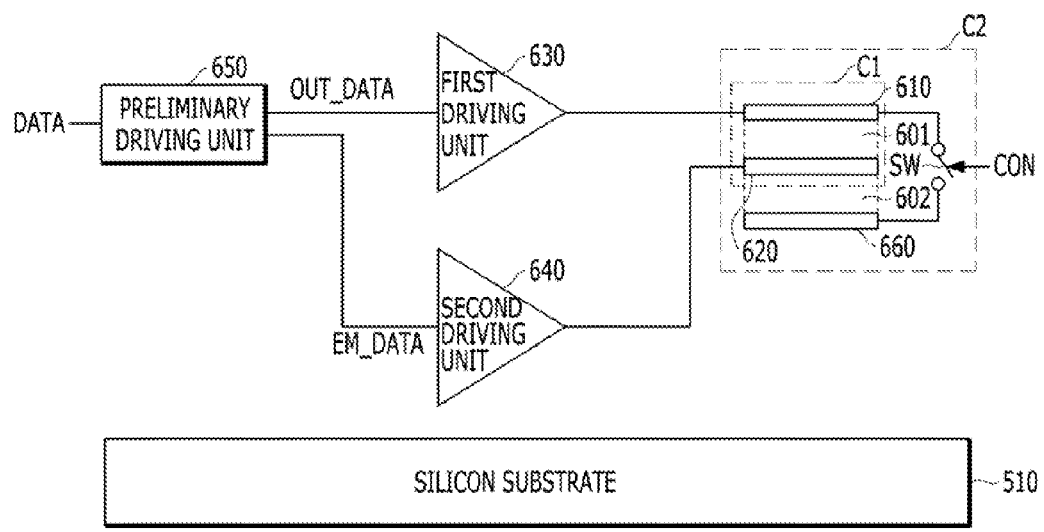
Figure 6C:
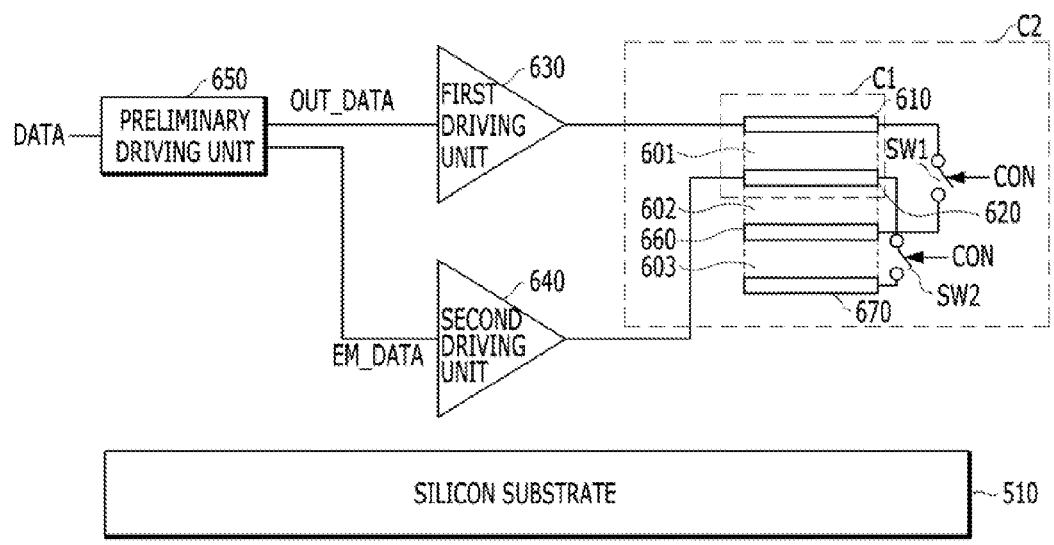

FIGS. 6A to 6C are diagrams showing parts of the configurations of semiconductor devices according to embodiments of the present invention.

FIG. 6A illustrates, an example, that a semiconductor device includes two stacked metal lines in a pad group.

Referring to FIG. 6A, the semiconductor device may include a first metal line 610, a second metal line 620, a first driving unit 630, a second driving unit 640, a preliminary driving unit 650, a silicon substrate 510, and an insulating layer 601 formed between the first metal line 610 and the second metal line 620. The semiconductor device of FIG. 5 may include the configuration of FIG. 6A as many as the pad groups PAD_GRP0 to PAD_GRPn. That is, each of the pad groups PAD_GRP0 to PAD_GRPn may have the configuration of FIG. 6A. An operation of the configuration of FIG. 6A is the same as that of the semiconductor device of FIG. 4A.

FIG. 6B illustrates, as an example, that a semiconductor device includes three stacked metal lines in a pad group.

Referring to FIG. 6B, the semiconductor device may include a first metal line 610, a second metal line 620, a first driving unit 630, a second driving unit 640, a preliminary driving unit 650, a silicon substrate 510, a third metal line 660, a first insulating layer 601 formed between the first metal line 610 and the second metal line 620, a second insulating layer 602 formed between the second metal line 620 and the third metal line 660, and a switch SW. The semiconductor device of FIG. 5 may include the configuration of FIG. 6B as many as the pad groups PAD_GRP0 to PAD_GRPn. That is, each of the pad groups PAD_GRP0 to PAD_GRPn may have the configuration of FIG. 6B. An operation of the configuration of FIG. 6B is the same as that of the semiconductor device of FIG. 4B.

FIG. 6C illustrates, as an example, that a semiconductor device includes four stacked metal lines in a pad group.

Referring to FIG. 6C, the semiconductor device may include a first metal line 610, a second metal line 620, a first driving unit 630, a second driving unit 640, a preliminary driving unit 650, a silicon substrate 510, a third metal line 660, a fourth metal line 670, a first insulating layer 601 formed between the first metal line 610 and the second metal line 620, a second insulating layer 602 formed between the second metal line 620 and the third metal line 660, a third insulating layer 603 formed between the third metal line 660 and the fourth metal line 670, a first switch SW1, and a second switch SW2. The semiconductor device of FIG. 5 may include the configuration of FIG. 6C as many as the of pad groups PAD_GRP0 to PAD_GRPn. That is, each of the pad groups PAD_GRP0 to PAD_GRPn may have the configuration of FIG. 6C. An operation of the configuration of FIG. 6C is the same as that of the semiconductor device of FIG. 4C.

Figure 7:
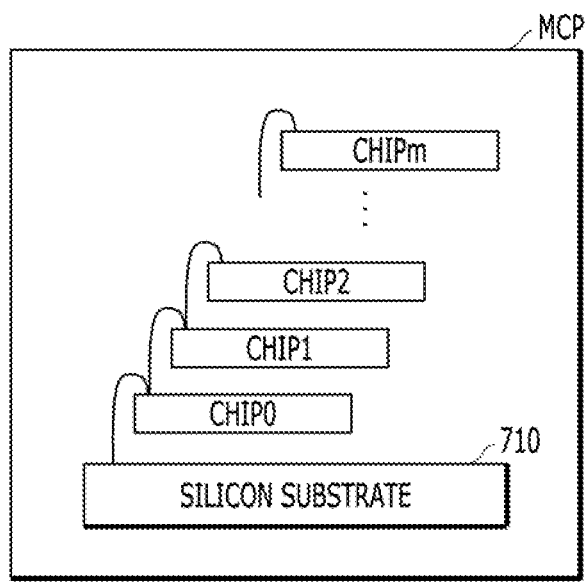
FIG. 7 is a block diagram of a semiconductor package MCP, according to an embodiment of the present invention.

FIG. 7 is a block diagram of a semiconductor package MCP according to an embodiment of the present invention.

Referring to FIG. 7, the semiconductor package MCP may include a plurality of semiconductor devices CHIP0 to CHIPm stacked over a silicon substrate 710. The silicon substrate 710 may include a package substrate. Each of the semiconductor devices CHIP0 to CHIPm may include a plurality of data output pads. The data output pads may be shared between the semiconductor devices CHIP0 to CHIPm. Each of the semiconductor devices CHIP0 to CHIPm of FIG. 7 may have the same configuration as the semiconductor device of FIG. 5.

As described above, since semiconductor devices perform pre-emphasis driving, through a capacitor, on an output pad thereof, load capacitance of the output pad may be reduced. Furthermore, the stack structure of metal lines formed to be used as an output pad may also be used as the capacitor. Hence, the semiconductor device may perform pre-emphasis without occupying a separate area for the capacitor.

Although various embodiments have been described for illustrative purposes, it will be apparent to those skilled in the art that various changes and modifications may be made without departing from the spirit and scope of the invention as defined in the following claims.

What is claimed is:

1. A semiconductor device, comprising:
a first metal line;
a second metal line;
a first insulating layer formed between the first metal line and the second metal line;
a preliminary driving unit suitable for generating first data and second data based on output data, the second data having a delayed and inverted phase of the first data;
a first driving unit coupled to the first metal line, the first driving unit being suitable for driving the first metal line in response to the first data;
a second driving unit coupled to the second metal line, the second driving unit being suitable for driving the second metal line in response to the second data;
a third metal line;
a second insulating layer formed between the second metal line and the third metal line; and
a switch coupled between the first metal line and the third metal line, the switch being suitable for being turned on/off in response to a control signal,
wherein the first to third metal lines are stacked to form a stack structure.

2. The semiconductor device of claim 1, wherein the first metal line, the first insulating layer, and the second metal line form a capacitor structure.

3. The semiconductor device of claim 1, wherein:
the first driving unit comprises an output driver; and
the second driving unit comprises a pre-emphasis driver.

4. The semiconductor device of claim 1, wherein the first metal line and the second metal line are formed to be used as a data output pad.

5. A semiconductor device, comprising:
a plurality of pad groups arranged in a first direction, each of the pad groups comprising first and second metal lines stacked in a second direction and a first insulating layer formed between the first and the second metal lines of each of the pad groups;
a preliminary driving unit suitable for generating first data and second data based on output data, the second data having a delayed and inverted phase of the first data;
a plurality of first driving units suitable for driving the first metal lines of the pad groups, respectively, in response to the first data;
a plurality of second driving units suitable for driving the second metal lines of the pad groups, respectively, in response to the second data,
a third metal line, wherein the first to third metal lines are stacked to form a stack structure;
a second insulating layer formed between the second metal line and the third metal line; and
a switch coupled between the first metal line and the third metal line and suitable for being turned on/off in response to a control signal.

6. The semiconductor device of claim 5, wherein the first metal line, the first insulating layer, and the second metal line form a capacitor structure.

7. The semiconductor device of claim 5, wherein:
the plurality of first driving units comprise an output driver; and
the plurality of second driving units comprise a pre-emphasis driver.

8. The semiconductor device of claim 5, wherein the first and the second metal lines extend in a third direction.

9. A semiconductor package, comprising:
a silicon substrate; and
a plurality of semiconductor devices stacked on the silicon substrate,
wherein each of the plurality of semiconductor devices comprises:
a plurality of pad groups arranged in a first direction, each of the pad groups comprising first and second metal lines stacked in a second direction and a first insulating layer formed between the first and the second metal lines of each of the pad groups;
a plurality of first driving units suitable for driving the first metal lines of the pad groups, respectively, in response to first data; and
a plurality of second driving units suitable for driving the second metal lines of the pad groups, respectively, in response to second data obtained by inverting and delaying the first data,
wherein each of the plurality of pad groups comprises:
a third metal line, wherein the first to third metal lines are stacked to form a stack structure;
a second insulating layer formed between the second metal line and the third metal line; and a switch coupled between the first metal line and the third metal line and suitable for being turned on/off in response to a control signal.

10. The semiconductor package of claim 9, wherein the first metal line, the first insulating layer, and the second metal line form a capacitor structure.

11. The semiconductor package of claim 9, wherein:
the plurality of first driving units comprises an output driver; and
the second driving unit comprises a pre-emphasis driver.

12. The semiconductor package of claim 9, wherein the first metal line and the second metal line are formed to be used as a data output pad.

13. The semiconductor package of claim 9, wherein the first and the second metal lines extend in a third direction.

14. A semiconductor device, comprising:
a first metal line;
a second metal line;
a first insulating layer formed between the first metal line and the second metal line;
a preliminary driving unit suitable for generating first data and second data based on output data, the second data having a delayed and inverted phase of the first data;
a first driving unit coupled to the first metal line, the first driving unit being suitable for driving the first metal line in response to the first data;
a second driving unit coupled to the second metal line, the second driving unit being suitable for driving the second metal line in response to the second data;
third and fourth metal lines;
a second insulating layer formed between the second metal line and the third metal line;
a third insulating layer formed between the third metal line and the fourth metal line;
a first switch coupled between the first metal line and the third metal line, the first switch being suitable for being turned on/off in response to a control signal; and
a second switch coupled between the second metal line and the fourth metal line, the second switch being suitable for being turned on/off in response to the control signal,
wherein the first to fourth metal lines are stacked to form a stack structure.

15. A semiconductor device, comprising:
a plurality of pad groups arranged in a first direction, each of the pad groups comprising first and second metal lines stacked in a second direction and a first insulating layer formed between the first and the second metal lines of each of the pad groups;
a preliminary driving unit suitable for generating first data and second data based on output data, the second data having a delayed and inverted phase of the first data;
a plurality of first driving units suitable for driving the first metal lines of the pad groups, respectively, in response to the first data;
a plurality of second driving units suitable for driving the second metal lines of the pad groups, respectively, in response to the second data;
third and fourth metal lines, wherein the first to fourth metal lines are stacked to form a tack structure;
a second insulating layer formed between the second metal line and the third metal line;
a third insulating layer formed between the third metal line and the fourth metal line;
a first switch coupled between the first metal line and the third metal line and suitable for being turned on/off in response to a control signal; and
a second switch coupled between the second metal line and the fourth metal line and suitable for being turned on/off in response to the control signal.

16. A semiconductor package, comprising:
a silicon substrate; and
a plurality of semiconductor devices stacked on the silicon substrate,
wherein each of the plurality of semiconductor devices comprises:
a plurality of pad groups arranged in a first direction, each of the pad groups comprising first and second metal lines stacked in a second direction and a first insulating layer formed between the first and the second metal lines of each of the pad groups;
a plurality of first driving units suitable for driving the first metal lines of the pad groups, respectively, in response to first data;
a plurality of second driving units suitable for driving the second metal lines of the pad groups, respectively, in response to second data obtained by inverting and delaying the first data;
third and fourth metal lines, wherein the first to fourth metal lines are stacked to form a tack structure;
a second insulating layer formed between the second metal line and the third metal line;
a third insulating layer formed between the third metal line and the fourth metal line;
a first switch coupled between the first metal line and the third metal line and suitable for being turned on/off in response to a control signal; and
a second switch coupled between the second metal line and the fourth metal line and suitable for being turned on/off in response to the control signal.

* * * * *